(12) United States Patent
Norris et al.

(10) Patent No.: US 7,676,736 B2
(45) Date of Patent: Mar. 9, 2010

(54) PROGRAMMABLE CONTINUOUS PHASE MODULATION (CPM) DECODER AND ASSOCIATED METHODS

(75) Inventors: James Anthony Norris, Fairport, NY (US); John Wesley Nieto, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 847 days.

(21) Appl. No.: 11/531,447

(22) Filed: Sep. 13, 2006

(65) Prior Publication Data

US 2008/0072125 A1    Mar. 20, 2008

(51) Int. Cl.
*H03M 13/03*    (2006.01)
(52) U.S. Cl. .................................................... 714/792
(58) Field of Classification Search .............. 714/792, 714/795, 786; 375/262, 341
See application file for complete search history.

(56) References Cited

U.S. PATENT DOCUMENTS

| | | | | |
|---|---|---|---|---|
| 5,844,947 A | * | 12/1998 | Cesari | 375/341 |
| 5,905,742 A | | 5/1999 | Chennakeshu et al. | 371/43.4 |
| 6,091,765 A | | 7/2000 | Pietzold, III et al. | 375/219 |
| 6,094,739 A | * | 7/2000 | Miller et al. | 714/792 |
| 6,205,187 B1 | | 3/2001 | Westfall | 375/341 |
| 6,343,207 B1 | | 1/2002 | Hessel et al. | 455/86 |
| 6,381,265 B1 | | 4/2002 | Hessel et al. | 375/219 |
| 6,389,078 B1 | | 5/2002 | Hessel et al. | 375/259 |
| 6,539,052 B1 | | 3/2003 | Hessel et al. | 375/225 |
| 6,721,371 B1 | * | 4/2004 | Barham et al. | 375/316 |
| 6,968,021 B1 | | 11/2005 | White et al. | 375/340 |
| 7,603,613 B2 | | 10/2009 | Pisek et al. | 714/795 |
| 2003/0126545 A1 | | 7/2003 | Tan | 714/786 |
| 2004/0255230 A1 | | 12/2004 | Chen et al. | 714/796 |

FOREIGN PATENT DOCUMENTS

WO    WO2006026334    3/2006

OTHER PUBLICATIONS

"Description and Performance Results for a Multi-H CPM telemetry Waveform", Mark Geoghegan, MILCOM 2000, 21$^{st}$ Century Military Communications Conference Proceedings, vol. 1, Oct. 22-25, 2000, pp. 353-357, XP010532613, IEEE, Piscataway, NJ, USA, ISBN: 978-07803-6521-6.

(Continued)

*Primary Examiner*—Shelly A Chase
(74) *Attorney, Agent, or Firm*—Allen, Dyer, Doppelt, Milbrath & Gilchrist, P.A.

(57) ABSTRACT

The programmable decoder, such as a Maximum Likelihood Sequence Estimation (MLSE) decoder (e.g. a Viterbi decoder) may include a programming input for a plurality of programmable trellis parameters, and a programmable device, such as an FPGA, connected to the programming input and implementing a continuous phase modulation (CPM) decoder including at least one trellis structure defined based upon the plurality of programmable trellis parameters. The plurality of programmable trellis parameters may include a number of trellis structures, a number of trellis states for each trellis structure, and a number of branches for each trellis state. Also, the trellis structure may include a reverse-state trellis structure.

22 Claims, 2 Drawing Sheets

OTHER PUBLICATIONS

Xilinx, "Viterbi Decoder v 3.0", Internet site www.xilinx.com; Product specification DS247 (v 1.0) Mar. 28, 2003.

Ginesi et al.; "Symbol and Superbaud Timing Recovery in Multi-H Continuous-Phase Modulation", IEEE Transactions on Comm., vol. 47, No. 5, May 1999; p. 664-666.

Miller et al.; "An Innovative Synchronization Preamble for UHF Milsatcom", 1999 IEEE, No. 0/7803-5538-5; pp. 1-5.

Kreitzer; "Tracking Parameter Selection for MIL-STD-188-181B Multi-H Continuous Phase Modulation", 1999 IEEE; No. 0/7803-5538-5.

Tessier et al., "A Reconfigurable, Power-Efficient Adaptive Viterbi Decoder", p. 1-5.

Actel Corp., "Designing Telecommunication Applications Using Digital Signal Processing Functions with FPGAs", Jun. 1997; pp. 1-5.

Internet site; http://en.wikipedia.org; "Field-programmable Gate Array", p. 1-6.

\* cited by examiner

PROGRAMMABLE CONTINUOUS PHASE MODULATION (CPM) DECODER AND ASSOCIATED METHODS

FIELD OF THE INVENTION

The present invention relates to the field of digital communications, and, more particularly, to trellis decoding and related methods.

BACKGROUND OF THE INVENTION

The new generation of UHF Satellite Communications Standards (MIL-STD-188-181C, MIL-STD-188-182B, and MIL-STD-188-183B) require (up to) 54 different modems to simultaneously reside in the SATCOM terminal. These standards include the DAMA/IW (demand-Assigned Multiple Access/Integrated Waveform) communications standards which are intended to increase existing satellite communications throughput by a factor of two. Designing the modems for the DAMA/IW standard requires new techniques to combine subfunctions of the modem to reduce software complexity and decrease development and integration time. Indeed, various satellite communication systems have limited program space, CPU computation speed, and battery power.

The use of Forward Error Correction (FEC) and the Maximum Likelihood Decoder (e.g. Viterbi Algorithm) is described exhaustively in most standard communications texts including "Digital Communications" by John G. Proakis. Continuous Phase Modulation is described in detail in books such as "Digital Phase Modulation" by Anderson, Aulin and Sundberg and "Digital Communications" by John G. Proakis.

In digital communications systems such as cellular and PCS (personal communications systems), computer communications systems, and SATCOM (satellite communications) systems, digital data is modulated by a modem onto a signal to be transmitted over a communications channel. Data is typically encoded before transmission to a receiver or to a storage device, to protect the data from errors which may result from a noisy communications channel or a defect in the storage medium. An encoder manipulates data symbols in accordance with an error correction code and produces error correction symbols or a structured redundancy output sequence. When the code word is later received or retrieved it is decoded to reproduce the data symbols, and errors in the data symbols are corrected, if possible, using the error correction symbols or the structured redundancy of code.

For the following discussion, a convolutional codeword is defined as the n output bits that are generated based on an input of k input bits (i.e. rate k/n code). One method of decoding code words encoded using a convolutional code is commonly referred to as maximum likelihood decoding. One kind of maximum likelihood decoder is commonly referred to as a Viterbi decoder. Conceptually, a Viterbi decoder uses a decoding trellis, which has a branch for each possible code word and connected paths of branches for each possible stream, or sequence, of code words. The decoder essentially finds a path through the trellis which is "closest" to, or most like, the received stream of code words. It then treats the code words on this "most likely" trellis path as the received code words and assigns data values to them, to produce a best estimate of the transmitted data.

To determine the most likely path, the decoder calculates, for each received code word, a set of branch metrics. A branch metric is a numerical representation of the likelihood that the transmitted code word, which may contain errors on reception, is actually the code word which corresponds to a particular branch. In one such decoder the branch metrics are the Hamming distances between the received code word and the code words associated with the various branches.

Each branch in the decoding trellis leads from an initial state, which represents the state that the registers are in prior to the formulation of the code word associated with the branch, and leads to an end state, which represents the state that the registers are in after the formulation of the code word. For a binary code there are $2^{K-1}$ possible states associated with each decoding level, where K is the constraint length of the code. For example, the code may have a constraint length of 3, i.e., there are 2 registers, and there are thus 4 possible register states, namely, 00, 01, 10, 11, in each decoding level. For a rate 1/n code, there are two possible branches leading from each initial state, namely a branch associated with a zero data bit and a branch associated with a one data bit. Each of these branches necessarily leads to a different end state. Thus for each of the $2^{K-1}$ states in a given decoding level, there are two branches leading to each of these states, and each branch may represent the transmitted code word. Accordingly, to decode the code word the decoder must determine two branch metrics for each of the $2^{K-1}$ possible end states, or a total of $2(2^{K-1})$ branch metrics.

Once the decoder calculates these branch metrics, it next determines the metrics of the various paths leading to the end states. Accordingly, the decoder adds to the branch metrics the appropriate path metrics, which are the sums of the branches leading to the initial states. The decoder then selects a most likely path leading to each of the end states and stores for later use the path metrics and information which identifies these most likely paths. These most likely paths which are also referred to as the "surviving paths." The decoder does not retain information relating to the less likely, or non-surviving, paths. In this way, the decoder "prunes" these paths from the trellis, and thereby eliminates for a next level of decoding a portion of the path metric calculations.

When a sufficient number of code words have been included in the trellis paths, the most likely code word path is chosen from the surviving paths associated with the end states. The decoder selects as the most likely path the code word path which is "closest" to the received data, i.e., the path with the smallest Hamming distance metric. The decoder then decodes the code words on the most likely path, or "traces back" along the path, to determine the associated data bits.

The Viterbi algorithm is used not only to decode convolutional codes but also to produce the maximum-likelihood estimate of the transmitted sequence through a channel with intersymbol interference (ISI). The Viterbi decoder is divided into three functional parts. The first part is an add-compare-select (ACS) unit that is used to calculate the path metrics. The second one is the survivor memory control unit for survivor memory management. The survivor memory, used to store the survivor sequences, is the last part of the Viterbi decoder.

Continuous phase modulation (CPM) is being applied in communications due to its bandwidth efficiency and constant envelope characteristics. With CPM, the modulated signal phase transitions are smoothed. For example, with binary phase shift keying (BPSK) a logic one is transmitted as one phase of a modulated signal and a logic zero is transmitted as a 180-degree shifted phase with a sharp transition in phase. This sharp phase transition results in broadening of the transmitted spectrum. With CPM the phase of the transmitted signal makes smooth phase changes over the bits of the modulating digital signal. An example of CPM is minimum shift keying (MSK) modulation.

Multi-h continuous phase modulation (multi-h CPM) is itself a broad class of modulated waveforms. The class includes signals with constant amplitude but varying phase. Multi-h CPM differs from the single-h format by using a set of H modulation indices in a cyclic manner. This results in delayed merging of neighboring phase trellis paths and ultimately, in improved error performance. A detailed description of multi-h CPM waveforms, is included in the book "Digital Phase Modulation" by Anderson, Aulin, and Sundberg, Plenum Press, New York, 1986.

Xilinx, Inc. of San Jose, Calif. provides an FPGA Viterbi Decoder with parameterizable constraint length, convolutional codes and traceback length as described in the data sheet DS247 (v1.0) Mar. 28, 2003 from Xilinx, Inc. However, such FPGA Viterbi decoder is not programmable for use with CPM signals.

Forward Error Correction (FEC) codes are commonly used in the communication industry. Digital signal processing techniques used for the demodulation and decoding of the FEC codes is well known in the art. However, the combination of CPM (e.g. multi-h CPM) and the use of FEC codes requires a new programmable decoder. There exists a need in the industry for a generic trellis decoder which can be used to decode convolutional codes, trellis coded modulation waveforms, ISI channels, single-h and multi-h CPM, for example.

SUMMARY OF THE INVENTION

In view of the foregoing background, it is therefore an object of the present invention to provide a programmable decoder including programmable trellis parameters for CPM.

This and other objects, features, and advantages in accordance with the present invention are provided by a programmable decoder, such as a Maximum Likelihood Sequence Estimation (MLSE) decoder (e.g. a Viterbi decoder) including at least one programming input for a plurality of programmable trellis parameters, and a programmable device connected to the programming input and implementing a continuous phase modulation (CPM) decoder comprising at least one trellis structure defined based upon the plurality of programmable trellis parameters.

The programmable device may comprise a field programmable gate array (FPGA), and CPM may be multi-h CPM. The plurality of programmable trellis parameters may include a number of trellis structures, a number of trellis states for each trellis structure, and a number of branches for each trellis state. Also, the trellis structure may include a reverse-state trellis structure.

An output may be connected to the programmable device for outputting decoded bits with multiple bits per output and the full traceback of all decoded bits for a best path, for outputting a difference between a best and worst path metric, and/or for outputting a winning state for a current best path.

A method aspect of the invention is directed to a method of implementing a continuous phase modulation (CPM) decoder and may include providing a programmable device (such as an FPGA) to implement the continuous phase modulation (CPM) decoder and comprising at least one trellis structure defined based upon a plurality of programmable trellis parameters. The method may further include programming the plurality of programmable trellis parameters via at least one programming input.

CPM may include multi-h CPM, and programming the plurality of programmable trellis parameters may include programming a number of trellis structures, programming a number of trellis states for each trellis structure, and programming a number of branches for each trellis state. The method may include providing at least one output connected to the programmable device for outputting decoded bits with multiple bits per output and the full traceback of all decoded bits for a best path, a difference between a best and worst path metric, and/or a winning state for a current best path.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
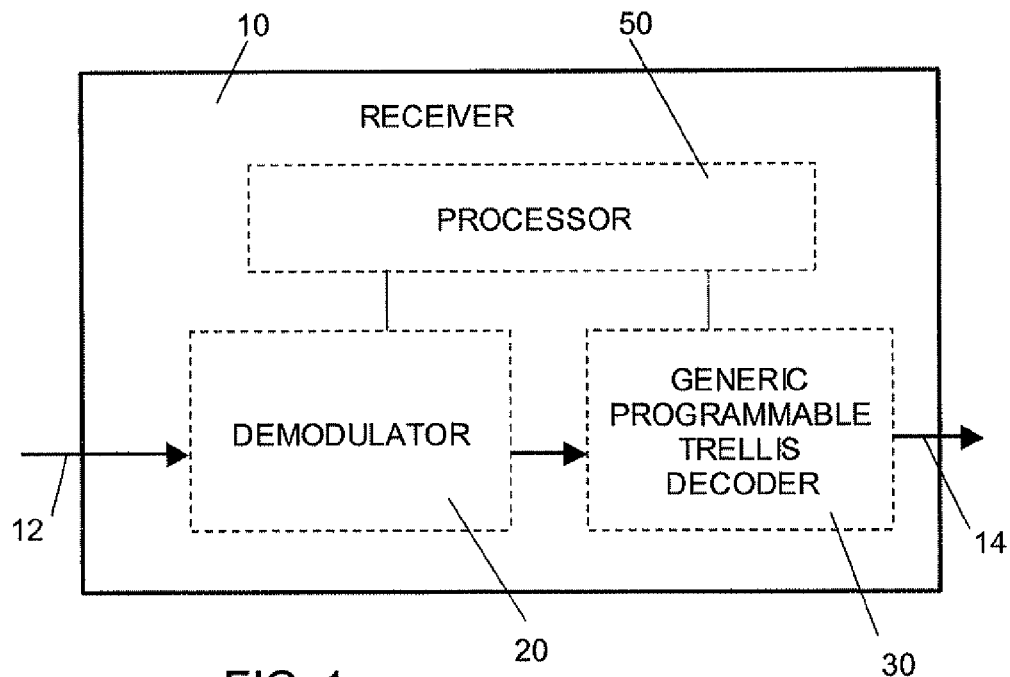
FIG. 1 is a block diagram of a receiver including a programmable trellis decoder in accordance with the present invention.
Figure 2:
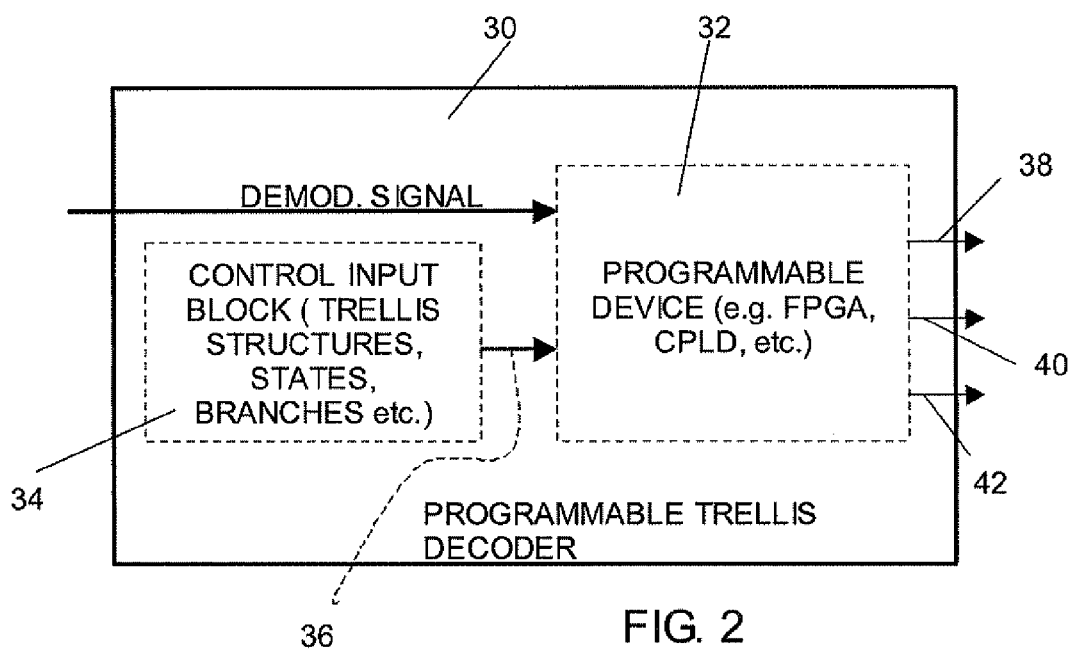
FIG. 2 is a more detailed block diagram of the programmable trellis decoder in the receiver of FIG. 1.

Referring initially to FIGS. 1 and 2, an embodiment of a data communications receiver 10, such as a UHF satellite communications receiver, including a generic programmable trellis decoder 30 (e.g. a continuous phase modulation (CPM) programmable decoder) will be described. Encoded and modulated signals sent over a communications channel 12 are received by the receiver 10. A demodulator 20 processes the incoming signal, then sends the baseband demodulated signal to the programmable trellis decoder 30. The programmable trellis decoder 30 processes the signal and then sends the decoded data and other related information to a destination over the channel 14. The components of the receiver, e.g. the demodulator 20 and the programmable trellis decoder 30, are controlled by a processor 50.

The programmable trellis decoder 30, such as a Maximum Likelihood Sequence Estimation (MLSE) decoder (e.g. a Viterbi decoder), includes at least one programming input 34, 36 for a plurality of programmable trellis parameters. The plurality of programmable trellis parameters preferably includes trellis connectivity information for trellis stages, active and inactive states for each trellis stage, a trellis branch transition data value and a metric index for trellis branch transition, and may include a number of trellis structures, a number of trellis states for each trellis structure, and a number of branches for each trellis state. Also, the trellis structure may include a reverse-state trellis structure and/or a forward-state trellis structure.

A programmable maximum likelihood decoder typically includes an add-compare-select (ACS) unit to receive a sequence of convolationally encoded bits and calculates path metrics and output sequences based upon branch metrics associated with each branch of a trellis-state diagram, a survivor memory for storing the output sequences, and a survivor memory control unit to control the survivor memory and output decoded bits of the stored output sequences, as would be appreciated by those skilled in the art.

A programmable device 32 is connected to the programming input and implements a programmable trellis decoder (e.g. a continuous phase modulation (CPM) decoder) having at least one trellis structure defined based upon the plurality of programmable trellis parameters. The programmable device 32 may comprise a field programmable gate array (FPGA), for example.

An FPGA is a semiconductor device containing programmable logic components and programmable interconnects. The programmable logic components can be programmed to duplicate the functionality of basic logic gates (such as AND, OR, XOR, NOT) or more complex combinatorial functions such as decoders or simple math functions. In most FPGAs, these programmable logic components (or logic blocks) also include memory elements, which may be simple flip-flops or more complete blocks of memories.

A hierarchy of programmable interconnects allows the logic blocks of an FPGA to be interconnected as needed by the system designer, somewhat like a one-chip programmable breadboard. These logic blocks and interconnects can be programmed after the manufacturing process by the customer/designer (i.e. "field-programmable") so that the FPGA can perform whatever logical function is needed.

FPGAs are generally slower than their application-specific integrated circuit (ASIC) counterparts, cannot handle as complex a design, and draw more power. However, they have several advantages such as a shorter time to market, ability to re-program in the field to fix bugs, and lower non-recurring engineering costs. Another alternative is complex programmable logic devices (CPLDs).

To define the behavior of the FPGA the user provides a hardware description language (HDL) or a schematic design. Common HDLs are VHDL and Verilog. Then, using an electronic design automation tool, a technology-mapped netlist is generated. The netlist can then be fitted to the actual FPGA architecture using a process called place-and-route, usually performed by place-and-route software. The user will validate the map, place and route results via timing analysis, simulation, and other verification methodologies. Once the design and validation process is complete, the binary file generated is used to (re)configure the FPGA device. Such a binary file may be stored and/or input to the programmable device 32 via the control input block 34.

As an example, the programmable trellis decoder 30 may implement CPM and preferably multi-h CPM. With CPM the phase of the transmitted signal makes smooth phase changes over the bits of the modulating digital signal. An example of CPM is minimum shift keying (MSK) modulation. Multi-h continuous phase modulation (multi-h CPM) is itself a broad class of modulated waveforms. The class includes signals with constant amplitude but varying phase. Multi-h CPM differs from the single-h format by using a set of H modulation indices in a cyclic manner. This results in delayed merging of neighboring phase trellis paths and ultimately, in improved error performance.

One or more outputs 38, 40, 42 of the programmable device 32 are provided for outputting decoded bits with multiple bits per output and the full traceback of all decoded bits for a best path, for outputting a difference between a best and worst path metric, and/or for outputting a winning state for a current best path.

The generic programmable trellis decoder 30 provides the appropriate structure and flexibility in the decoder to handle all the above-mentioned trellis schemes. The active and inactive states per trellis stage can be done by having a start state and delta increment between states or an active/inactive flag. Active/inactive provides more flexibility as there may be cases where there are no good delta increments between current and next active state. A different starting state for each trellis stage may be provided to avoid extra computations but active/inactive state works here too. Metrics to be used as branch metrics are provided by user based on required trellis stage, node identification and branch connection. Only metrics for active states need to be computed. A different set of branch connections are included for each trellis stage via a reverse lookup table at the add/compare/select point.

An example for stage 0 (if trellis has 16 states there would be 16 states for each trellis stage). The repeat structure may be 4 trellis stages long and for each stage there would be active and inactive stages and reverse lookup tables. This type of structure would be required for a multi-h CPM but this same structure could be used for less complicated trellis schemes by simply changing the connectivity of the trellis reverse look-up table and the choice of active/inactive states. Thus, the approach leads to a generic trellis decoder which can handle many more trellis schemes than simple convolutional/TCM decoders available currently.

As an example, a multi-h CPM waveform may be demodulated with the generic programmable trellis decoder 30. Multi-h implies a different modulation index h for each CPM symbol. For the case of 2h, there are two different values of h that change every other symbol. For example, binary CPM with h0=4/16, h1=5/16. Even number symbols use modulation index h0, and odd number symbols use modulation index h1. For h0=4/16, the trellis backward connectivity is as follows (data 0= negative frequency (i.e. data=−1); data 1=positive frequency):

Format: State number: previous data=0 previous data=1

| | | |
|---|---|---|
| State 0: | 4 | 12 |
| State 1: | 5 | 13 |
| State 2: | 6 | 14 |
| State 3: | 7 | 15 |
| State 4: | 8 | 0 |
| State 5: | 9 | 1 |
| State 6: | 10 | 2 |
| State 7: | 11 | 3 |
| State 8: | 12 | 4 |
| State 9: | 13 | 5 |
| State 10: | 14 | 6 |
| State 11: | 15 | 7 |
| State 12: | 0 | 8 |
| State 13: | 1 | 9 |
| State 14: | 2 | 10 |
| State 15: | 3 | 11 |

For h1=5/16, the trellis backward connectivity is as follows:

| | | |
|---|---|---|
| State 0: | 5 | 11 |
| State 1: | 6 | 12 |
| State 2: | 7 | 13 |
| State 3: | 8 | 14 |
| State 4: | 9 | 15 |
| State 5: | 10 | 0 |
| State 6: | 11 | 1 |
| State 7: | 12 | 2 |
| State 8: | 13 | 3 |
| State 9: | 14 | 4 |
| State 10: | 15 | 5 |
| State 11: | 0 | 6 |
| State 12: | 1 | 7 |
| State 13: | 2 | 8 |
| State 14: | 3 | 9 |
| State 15: | 4 | 10 |

Analyzing the trellis structure for symbols (stages) 1, 2, ..., 8:

Format: H# Start_State Delta_State

| | | | |
|---|---|---|---|
| Stage 1 | H0 | 0 | 2 |
| Stage 2 | H1 | 0 | 2 |
| Stage 3 | H0 | 1 | 2 |
| Stage 4 | H1 | 1 | 2 |
| Stage 5 | H0 | 0 | 2 |
| Stage 6 | H1 | 0 | 2 |
| Stage 7 | H0 | 1 | 2 |
| Stage 8 | H1 | 1 | 2 |

To decode Stage 1, start at state 0 and increment states by two for next state (i.e. only even states are active). For Stage 2, only decode even states again. For Stage 3, decode only odd states and for Stage 4 decode only odd states and then pattern repeats.

This is why the generic programmable trellis decoder 30 provides the ability to have active states and inactive states (for most general case) or start state and delta state (as an alternative embodiment). Also, the backward trellis structure may be needed to decode CPM properly.

So, the initialization process of the generic programmable trellis decoder 30 prior to use in demodulating waveform will now be summarized. The trellis structure includes: Stage N; Trellis Connectivity; Active/Inactive States; Data Value causing Transition (i.e. branch transition data value); and Metric index for given trellis branch transition.

First, the trellis structure (e.g. for CPM or other) is analyzed to determine active/inactive states and connectivity. The connectivity information is written to decoder for as many trellis stages as is necessary before pattern repeats (typically just one stage for convolutional codes, two for 1h CPM and four for 2h CPM example above). Active/inactive states (or start state and delta state) are written for each trellis stage of trellis decoder (before pattern repeats). The data value that causes trellis branch transition is written to the trellis decoder structure. The metric index used for trellis branch transition is written to trellis decoder.

Example: Trellis Branch Structure Stage 0. The backward trellis structure includes: State 0 from State 4 via a 0 bit using branch metric index 0; State 0 from State 12 via a 1 bit using branch metric index 1; State 1 from State 5 via a 0 bit using branch metric index 2; State 1 from State 13 via a 1 bit using branch metric index 3, etc.

To begin demodulating data: the branch metric array is written to trellis decoder (this will be used by decoder using the metric index); add/compare/select function is executed for each active state; traceback function is executed to extract decoded information; and output data is provided to user.

Figure 3:
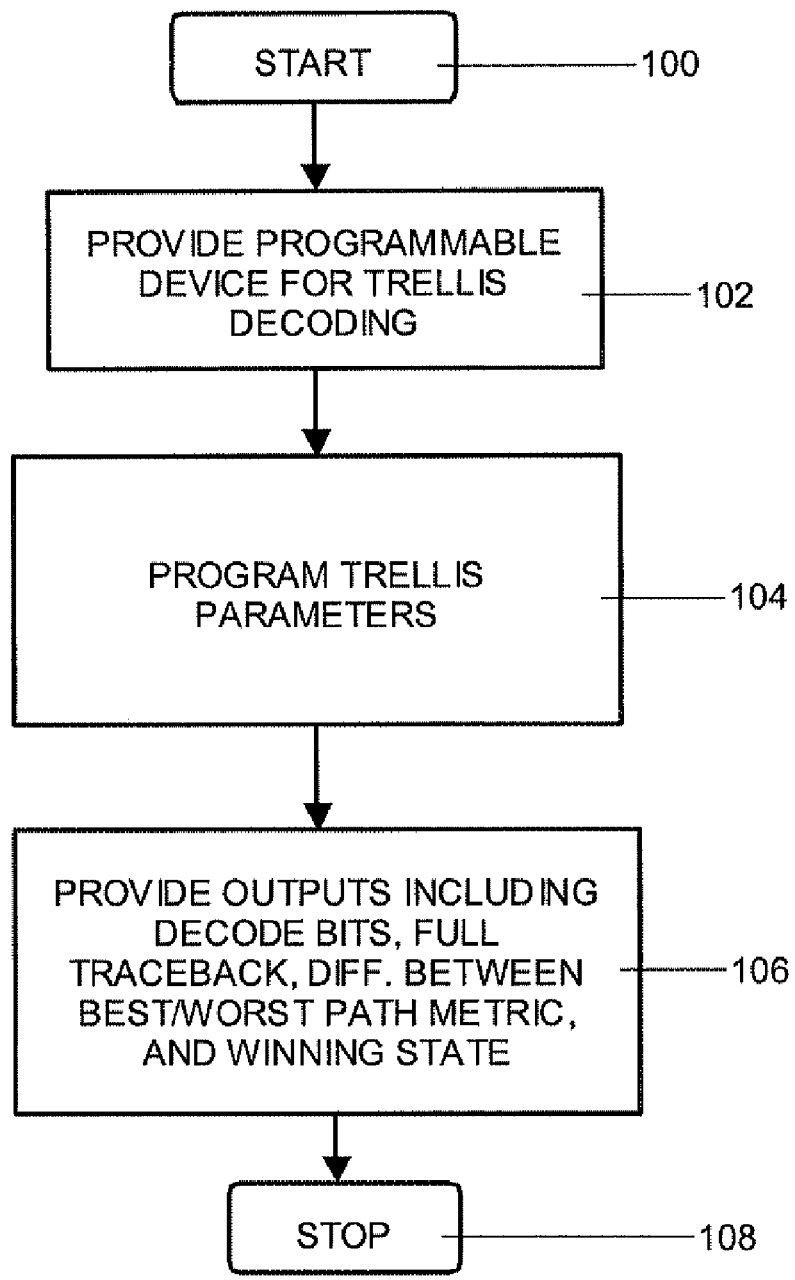
FIG. 3 is a flowchart illustrating steps in a method of implementing the programmable trellis decoder of the present invention.

A method aspect of the invention is directed to a method of implementing a generic programmable trellis decoder 30 (such as a continuous phase modulation (CPM) decoder) and will be discussed with reference to the flowchart of FIG. 3. The method begins at block 100 and includes, at block 102, providing a programmable device 32 (such as an FPGA) to implement the programmable trellis decoder 30 and includes at least one trellis structure defined based upon a plurality of programmable trellis parameters preferably including trellis connectivity information for trellis stages, active and inactive states for each trellis stage, trellis branch transition data value and metric index for trellis branch transition. The method further includes programming the plurality of programmable trellis parameters via at least one programming input (block 104).

As discussed above, programming the plurality of programmable trellis parameters may include programming a number of trellis structures, programming a number of trellis states for each trellis structure, and programming a number of branches for each trellis state. The method may include, at block 106, providing at least one output connected to the programmable device 32 for outputting decoded bits with multiple bits per output and the full traceback of all decoded bits for a best path, a difference between a best and worst path metric, and/or a winning state for a current best path.

To meet various requirements, an FPGA-based maximum likelihood decoder has been designed which is programmable and will support demodulation of CPM, SOQPSK, BPSK, and QPSK with any FEC code. It has been designed to support binary-h, 4-ary, CPM. The input programmability includes the number of states in each trellis, the number of branches per state, the number of trellis structure (Multi-h CPM has two different trellis'), and the reverse-state trellis structure itself which connects each state with the list of previous states and the data bit(s) that go with the symbols which branch into the current state. The output of the decoder includes decoded bits with multiple bits per output and the full traceback of all decoded bits for that path, the difference between the best and worst path metrics and, the winning state for the current best path. Note that a slightly more complicated but equivalent device could be created by using forward-state trellis structures instead of reverse-state trellis structures. Furthermore, instead of a full traceback of decoded bits, only the bit of interest can be provided (i.e. bit(s) located traceback depth away (oldest most reliable bit(s))).

It should be noted that for a convolutional code, the branch metrics are determined by the number of bits out of the encoder. For example, for a rate ½ code, there are only 4 metrics ($2^2$) (independent of the number of trellis states). For CPM, the number of metrics is much larger since each path through the trellis will be a unique CPM waveform. By having an index associated with each trellis branch path metric, both cases are covered (and others such a TCM and ISI channels).

The full traceback is an additional feature which is not required. By having a full traceback, newer data output by decoder can be used for a phase tracking and/or symbol timing loop (less delay) while using the oldest bits output by decoder for data (the older the data, i.e. larger traceback, the more reliable the data, but there is more delay). Carrier tracking and symbol timing loops do not want to have long delays thus the use of less delayed bits. However, even the less delayed bits used for tracking loops would benefit from some coding gain of the trellis (when compared to using no delay decisions for tracking loops).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A programmable decoder comprising:
   at least one programming input for a plurality of programmable trellis parameters; and
   a programmable device connected to said at least one programming input and implementing a continuous phase modulation (CPM) decoder comprising at least one trellis structure defined based upon the plurality of programmable trellis parameters.

2. The programmable decoder according to claim 1 wherein the programmable device comprises a field programmable gate array (FPGA).

3. The programmable decoder according to claim 1 wherein CPM comprises multi-h CPM.

4. The programmable decoder according to claim 1 wherein the plurality of programmable trellis parameters comprises:
   a number of trellis structures;
   a number of trellis states for each trellis structure; and
   a number of branches for each trellis state.

5. The programmable decoder according to claim 1 wherein the at least one trellis structure comprises at least one reverse-state trellis structure.

6. The programmable decoder according to claim 1 further comprising at least one output connected to said programmable device for outputting decoded bits with multiple bits per output.

7. The programmable decoder according to claim 6 wherein the at least one output is also for outputting a full traceback of all decoded bits for a best path.

8. The programmable decoder according to claim 1 further comprising at least one output connected to said programmable device for outputting a difference between a best and worst path metric.

9. The programmable decoder according to claim 1 further comprising at least one output connected to said programmable device for outputting a winning state for a current best path.

10. The programmable decoder according to claim 1 wherein the at least one trellis structure comprises at least one forward-state trellis structure.

11. The programmable decoder according to claim 1 wherein said programmable device implements a CPM Maximum Likelihood Sequence Estimation (MLSE) decoder.

12. The programmable decoder according to claim 11 wherein said MLSE decoder comprises a Viterbi decoder.

13. A programmable Maximum Likelihood Sequence Estimation (MLSE) decoder comprising:
   at least one programming input for programming a plurality of programmable trellis parameters including a number of trellis structures, a number of trellis states for each trellis structure, and a number of branches for each trellis state; and
   a field programmable gate array (FPGA) connected to said at least one programming input and implementing a multi-h continuous phase modulation (CPM) decoder comprising at least one trellis structure defined based upon the plurality of programmable trellis parameters.

14. The programmable MLSE decoder according to claim 13 wherein the at least one trellis structure comprises at least one reverse-state trellis structure.

15. The programmable MLSE decoder according to claim 13 further comprising at least one output connected to said programmable device for outputting decoded bits with multiple bits per output and a full traceback of all decoded bits for a best path.

16. The programmable MLSE decoder according to claim 13 further comprising at least one output connected to said FPGA for outputting a difference between a best and worst path metric.

17. The programmable MLSE decoder according to claim 13 further comprising at least one output connected to said FPGA for outputting a winning state for a current best path.

18. A method of implementing a continuous phase modulation (CPM) decoder, the method comprising:
   providing a programmable device to implement the continuous phase modulation (CPM) decoder and comprising at least one trellis structure defined based upon a plurality of programmable trellis parameters; and
   programming the plurality of programmable trellis parameters via at least one programming input connected to the programmable device.

19. The method according to claim 18 wherein providing the programmable device comprises providing a field programmable gate array (FPGA).

20. The method according to claim 18 wherein CPM comprises multi-h CPM.

21. The method according to claim 17 wherein programming the plurality of programmable trellis parameters comprises:
   programming a number of trellis structures;
   programming a number of trellis states for each trellis structure; and
   programming a number of branches for each trellis state.

22. The method according to claim 17 further comprising providing at least one output connected to the programmable device for outputting at least one of:
   decoded bits with multiple bits per output;
   a full traceback of all decoded bits for a best path;
   a difference between a best and worst path metric; and
   a winning state for a current best path.

* * * * *